US008259507B2

(12) United States Patent
Joo (10) Patent No.: US 8,259,507 B2
(45) Date of Patent: Sep. 4, 2012

(54) WORD LINE BOOSTER FOR FLASH MEMORY DEVICE

(75) Inventor: Young Dong Joo, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/259,040

(22) Filed: Oct. 27, 2008

(65) Prior Publication Data

US 2012/0069682 A1 Mar. 22, 2012

(30) Foreign Application Priority Data

Jul. 2, 2008 (CN) .......................... 2008 1 0040285

(51) Int. Cl.
*G11C 16/08* (2006.01)
(52) U.S. Cl. .............................. 365/185.25; 365/185.23
(58) Field of Classification Search ............ 365/185.18, 365/189.11, 233.5, 185.25, 185.23
See application file for complete search history.

(56) References Cited

U.S. PATENT DOCUMENTS

| 6,018,479 A * | 1/2000 | Jeong ........................ 365/189.11 |
| 6,255,900 B1 * | 7/2001 | Chang et al. .................. 327/589 |
| 6,721,210 B1 * | 4/2004 | Oh et al. .................. 365/189.09 |

\* cited by examiner

*Primary Examiner* — Hoai V Ho
*Assistant Examiner* — Tri Hoang
(74) *Attorney, Agent, or Firm* — Kilpatrick Townsend & Stockton LLP (57) ABSTRACT

A nonvolatile memory device includes an array of rows and columns of memory cells and a plurality of word lines and bit lines associated with the memory cells. The memory device further includes a word line booster circuit coupled with the word lines for supplying a selected word line with a specific voltage as a drive voltage during an operation of the memory device. The word line booster circuit includes a first boosting capacitor and a second boosting capacitor connected in parallel to generate a boosting voltage and a first precharge circuit for precharging the first and second boosting capacitors. The word line booster circuit further includes a third boosting capacitor operatively connected to the first and second boosting capacitors via a charge-sharing transistor, the third boosting capacitor being connected to one end of a load resistor to generate an output signal at the other end of the load resistor when the charge sharing transistor is enabled.

20 Claims, 7 Drawing Sheets

WORD LINE BOOSTER FOR FLASH MEMORY DEVICE

CROSS-REFERENCE TO RELATED APPLICATIONS

This application claims priority to Chinese Patent Application No. 200810040285.6, filed Jul. 2, 2008, commonly assigned, and incorporated herein by reference for all purposes.

BACKGROUND OF THE INVENTION

The present invention generally relates to semiconductor integrated circuits and more particularly, the present invention provides a word line booster circuit to drive word lines for non-volatile memory devices.

A memory device includes an array of memory cells that are arranged in rows and columns. Parallel data transfer lines or bit lines are provided and connected to the current carrying electrodes of cell transistors in columns of memory cells. Parallel control lines or word lines are associated with the control electrodes of rows of memory cells. When a word line is activated, and a certain bit line is selected, the transistor in a selected memory cell is rendered conductive to transfer digital information from the cell capacitor to a corresponding bit line therein. The digital information is thus read from the selected memory cell.

A high voltage that is supplied via the word lines to the control gates of memory cell transistors should be arranged to be potentially greater in magnitude than the information voltage of high level on the bit lines. The difference between the voltages is necessary in order to compensate for a potential drop of a word line drive voltage due to the threshold voltages of the memory cell transistors. The high voltage is generated using a specific capacitor that is arranged within a word line booster circuit. The capacitor may act as the "booting" or bootstrap capacitor for producing a word line drive voltage that is higher than the power supply voltage Vcc of DRAM. Generally, the bootstrap capacitor is precharged at its one electrode toward the power supply voltage and the other electrode thereof is initially at the ground potential, and then driven to rise up to the power supply voltage, thereby producing the word line drive voltage of a suitable potential level with such a voltage booting system.

Generally, word line booster circuit generates word line voltage when address transition detection signal is triggered by address change. During write mode, write control signal from logic controller generates related signals to control charge pump. The pumping voltage generated by the charge pump drives row decoders and column decoders through the high voltage switch. During read mode, word line voltage from word line booster is provided instead of the pumping voltage.

In case of flash memory EEPROM, word line bias of around 9V and bit line bias of around 5V are required for the purpose of programming data into memory cells using the hot electron injection mechanism. During read mode, word line bias of around 3V and bit line voltage of about 1V are required to read information from the programmed cells or erased cells. For these memory operations, a word line booster circuit which generates a stable word line voltage with little variation in the power supply voltage having low power consumption is desired for manufacturing low power high voltage nonvolatile memory devices.

From the above, it is seen that an improved word line booster circuit with little variation in the power supply voltage during read mode or verify mode of the memory operation is desired.

BRIEF SUMMARY OF THE INVENTION

The present invention is generally related to semiconductor integrated circuits and more particularly, the present invention provides a word line driver circuit to drive word lines during read mode or data verification mode for non-volatile memory devices.

In a specific embodiment, a nonvolatile memory device includes an array of rows and columns of memory cells and a plurality of word lines and bit lines associated with the memory cells. The memory device further includes a word line booster circuit coupled with the word lines for supplying a selected word line with a word line voltage during an operation of the memory device, wherein the word line booster circuit includes a first boosting capacitor and a second boosting capacitor connected in parallel each other and a first precharge circuit for precharging the first boosting capacitor and the second boosting capacitor. The word line booster circuit further includes a third boosting capacitor operatively connected to the first boosting capacitor and the second boosting capacitor via a charge-sharing transistor, the third boosting capacitor being connected to one end of a load resistor to generate an output signal at the other end of the load resistor to be used as the word line voltage when the charge sharing transistor is enabled and a second precharge circuit for precharging the third boosting capacitor. In addition, the word line booster circuit includes a high voltage detector circuit to generate a detecting signal when the word line voltage reaches a target voltage during read mode of the nonvolatile memory device and a clock control circuit adapted to enable the charge sharing transistor and to disable one of the first boosting capacitor and the second boosting capacitor upon receiving a control signal from the address transition detector and the detecting signal from the voltage detector.

In another embodiment, the invention provides a nonvolatile memory device including an array of rows and columns of memory cells and a plurality of word lines and bit lines associated with the memory cells. The memory device further includes a word line booster circuit coupled with the word lines for supplying a selected word line with the specific voltage as a drive voltage during an operation of the memory device, wherein the word line booster circuit includes a first boosting capacitor and a second boosting capacitor connected in parallel each other adapted to generate a boosting voltage and a first precharge circuit for precharging the first boosting capacitor and the second boosting capacitor. The world line booster circuit further includes a third boosting capacitor operatively connected to the first boosting capacitor and the second boosting capacitor via a charge-sharing transistor, the third boosting capacitor being connected to one end of a load resistor to generate an output signal at the other end of the load resistor when the charge sharing transistor is enabled and a high voltage detector to generate a detecting signal in response to a control signal from an address transition detector and the output signal generated by the third boosting capacitor and load resistor. In addition, the word line booster circuit includes a clock control circuit adapted to enable the charge sharing transistor and to disable one of the first boosting capacitor and the second boosting capacitor upon receiving the control signal from the address transition detector and the detecting signal from the voltage detector and a discharge circuit to discharge the boosting voltage at a node connected to the third boosting capacitor.

Many benefits are achieved by way of embodiments of the present invention over conventional techniques. The present invention offers significant unobvious advantages in the fabrication of nonvolatile memory device having an improved short channel effect and leakage characteristics. Depending upon the embodiment, one or more of these benefits may be achieved. These and other benefits will be described in more throughout the present specification and more particularly below.

BRIEF DESCRIPTION OF THE DRAWINGS

Exemplary embodiments of the invention are more fully described in detail with reference to the accompanied drawings. The invention may be embodied in many different forms and should not be construed as being limited to the exemplary embodiments set forth herein. Rather, these exemplary embodiments are provided so that this disclosure is thorough and complete, and to convey the concepts of the invention to those skilled in the art.

DETAILED DESCRIPTION OF THE INVENTION

The present invention generally relates to semiconductor integrated circuits and more particularly, the present invention provides a word line booster circuit to drive word lines during read mode or data verification mode for non-volatile memory devices. It is understood that the examples and embodiments described herein are for illustrative purposes only and that various modifications or changes in light thereof will be suggested to persons skilled in the art and are to be included within the spirit and purview of this application and scope of the appended claims.

Figure 1:
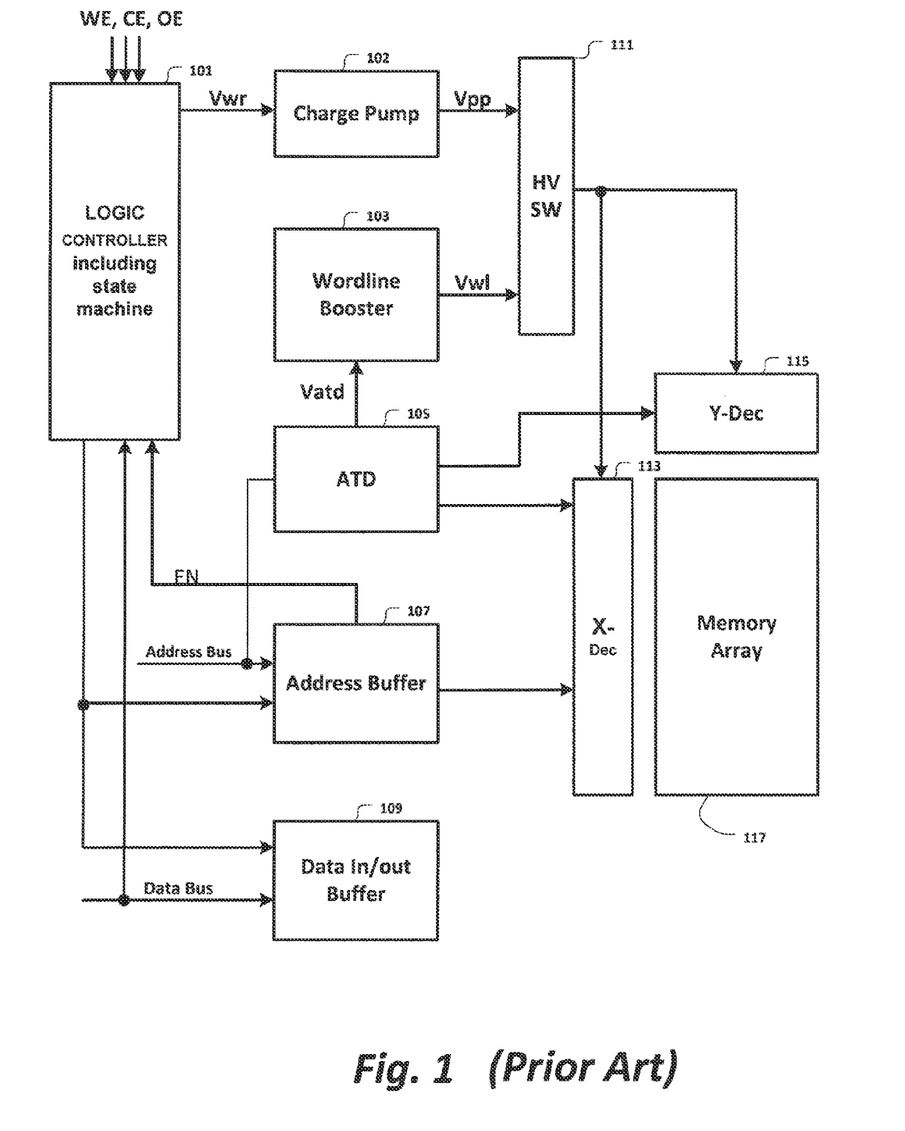
FIG. 1 is a simplified block diagram illustrating a conventional flash memory device.

FIG. 1 is a simplified block diagram illustrating a conventional flash memory device.

Logic controller including state machine 101 controls overall circuit blocks with input addresses and data. Address bus signals are input to address buffer 107 and address transition detector (ATD) circuit 105. ATD circuit 105 generates related signals when there is an address transition in a read mode operation to control the memory access. Also, ATD 105 generate its output signal Vatd to control a word line booster 103. Word line booster 103 generates word line voltage Vwl when ATD 105 outputs a signal Vatd that is triggered by an address change. During write mode, a write control signal Vwr from Logic Controller 101 generates related signals to control a charge pump 102. The pumping voltage Vpp drives a row decoder 113 and a column decoder 115 through the High Voltage Switch 111. During read mode, word line voltage Vwl from word line booster 103 is provided instead of the pumping voltage Vpp as shown in FIG. 1.

In case of flash memory EEPROM, word line bias of around 9V and bit line bias of around 5V are used to program data into memory cells using the hot electron injection mechanism. During the read mode, word line bias of around 3V and bit line voltage of about 1V are used to read information from the programmed cells or erased cells. Flash memory array 117 contains memory cells and decoder circuits.

Figure 2:
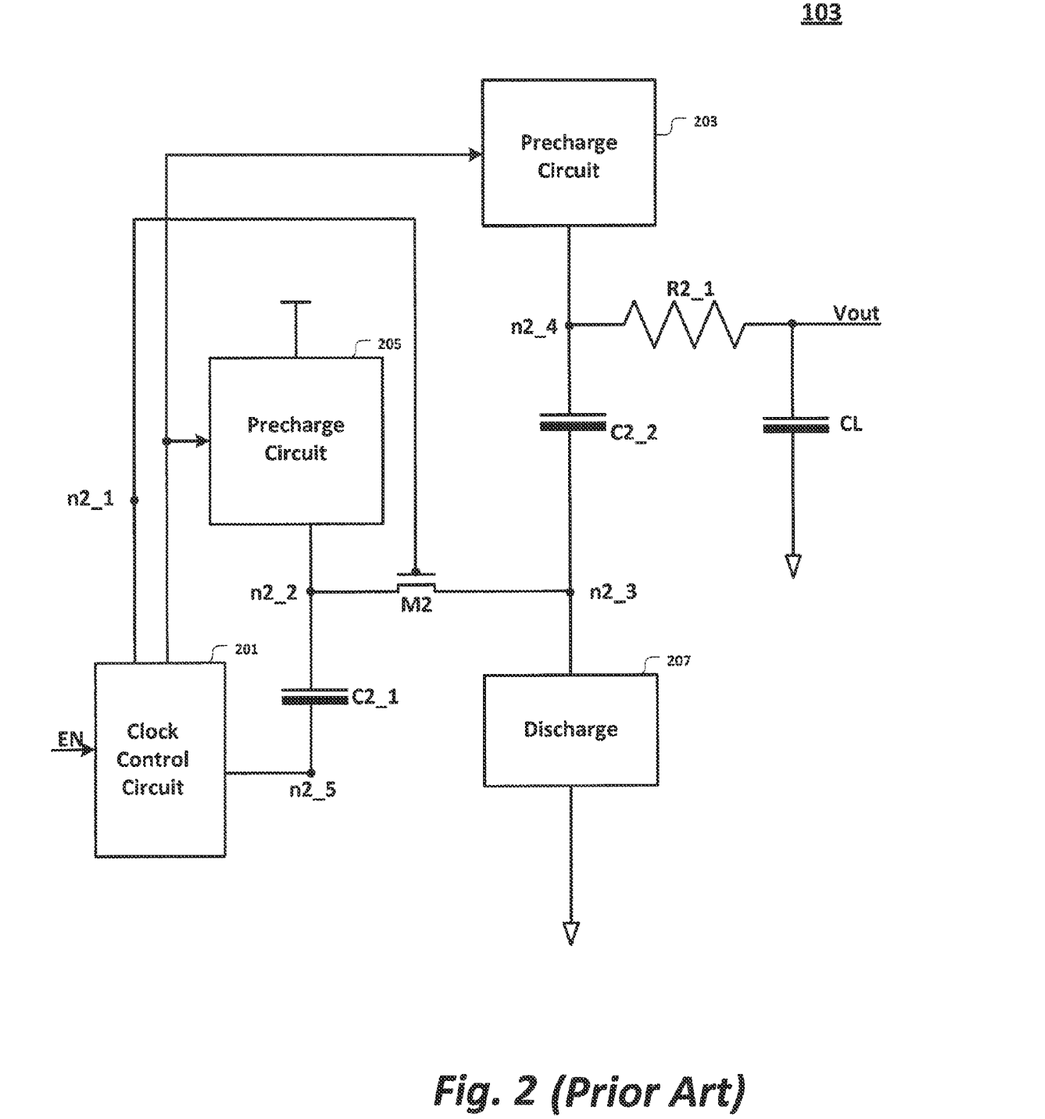
FIG. 2 is a simplified diagram illustrating a conventional word line booster circuit.

FIG. 2 is a simplified diagram illustrating a conventional word line booster circuit 103 shown in FIG. 1. The function of each circuit block and element is as follows. The "EN" signal from ATD block 105 of FIG. 1 is input to Clock Control Circuit 201. Capacitors C2_1 and C2_2 are boosting capacitors and capacitor CL represents total load capacitance including all output junction capacitance and signal capacitances in driving the word lines during read mode. The precharge circuit blocks 203 and 205 are adapted to precharge nodes n2_2 and n2_4 before boosting these nodes.

Let's assume these capacitor nodes are precharged at Vcc (power supply voltage). When "EN" signal becomes "H" (enabled state), a potential increase at node n2_5 causes capacitor C2_1 to boost the voltage at node n2_2 to Vcc+ αVcc (α: coupling coefficient). Responding to the increased node voltage at node n2_2, PMOS transistor M2 turns on, causing voltage at node n2_3 to be increased toward the voltage at node n2_2 by charge sharing. This charge-shared voltage at node n2_3 then causes load capacitors C2_2 and CL to bootstrap. Resistor R2_1 represents output resistance including signal loadings. From the above, output voltage Vout of the word line booster circuit 100 can be obtained as follows:

$$Vout = Vcc + C2\_2/(CL+C2\_2) \times [(C2\_1+C2\_2//CL)] \times (Vcc+\alpha Vcc)$$

As shown above equation, output voltage Vout of the word line booster circuit is generally dependent on power supply voltage Vcc. However, it is desirable that more stable bias voltage be provided to the word lines. An improved word line booster circuit is described according to an embodiment of the present invention with reference to FIG. 3.

Figure 3:
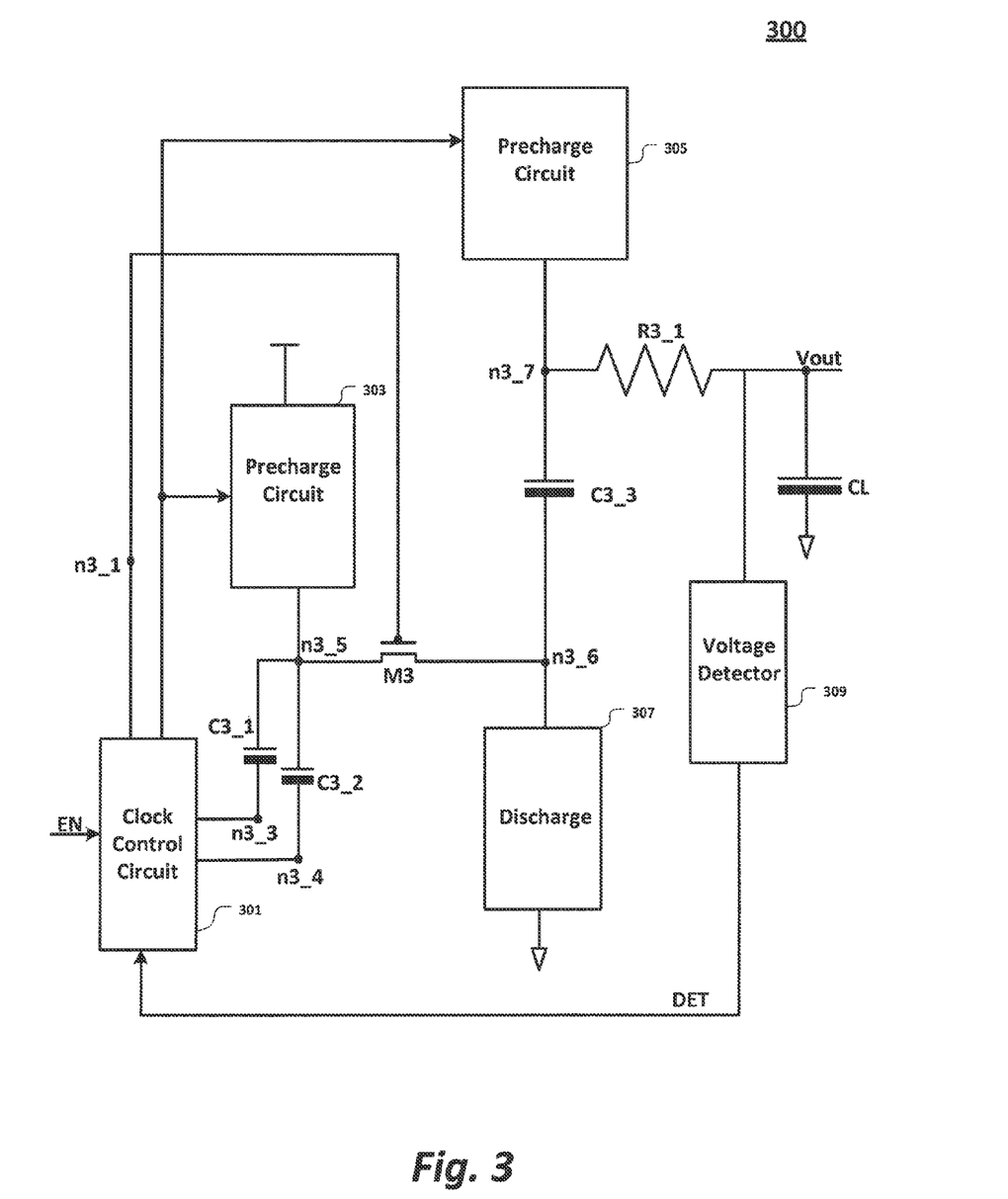
FIG. 3 is a simplified diagram illustrating a word line booster circuit according to an embodiment of the present invention.

FIG. 3 is a simplified diagram illustrating a word line booster circuit according to an embodiment of the present invention. Referring to FIG. 3, voltage detector 309 is connected to output terminal of word line booster circuit 300 and its output is fed back to clock control circuit 301 to control output voltage Vout of the word line booster circuit 300. In the present embodiment, capacitors C3_1 and C3_2 constitute boosting capacitors controlled by clock control circuit 301. The "EN" signal coming from ATD block 105 of FIG. 1 is input to the clock control circuit 301. Load capacitor CL represents the sum of all output junction capacitances and signal capacitances in driving the word lines during read mode.

The precharge circuits 303 and 305 precharge nodes n3_5 and n3_7 before boosting these nodes. For the purpose of explanation, let's assume that these node voltages are precharged at Vcc (power supply voltage). When EN becomes "H" (enable state), voltage at nodes n3_3 and n3_4 causes capacitors C3_1 and C3_2 to boost the node voltage of n3_5 up to Vcc+αVcc (α: coupling coefficient). And PMOS transistor M3 is turned on by the signal from the clock control circuit (see FIG. 7). The node voltage at n3_5 causes charge sharing between the nodes n3_5 and n3_6 to occur. However, if the output signal DET of the voltage detector 309 is "L", the node voltage at node n3_4 is "L" (see FIG. 7), discharging capacitor C3_2.

This charge-shared voltage at node n3_6 causes capacitor C3_3 and CL to boost output voltage Vout. Resistor R3_1 represents total resistance value at output node. From the above, Vout can be obtained as follows: Vout= Vcc+C3_3/(CL+C3_3)×[C3_1+C3_2/(C3_1+C3_2+C3_3//CL)]×(Vcc+αVcc). As the equation indicates, the amount of charge coupling can be more flexibly adjusted by employing additional boosting capacitors controlled by clock control circuit 301. Depending on the target output voltage Vout of the word line booster circuit, more than two boosting capacitors can be employed and coupled together.

Figure 4:
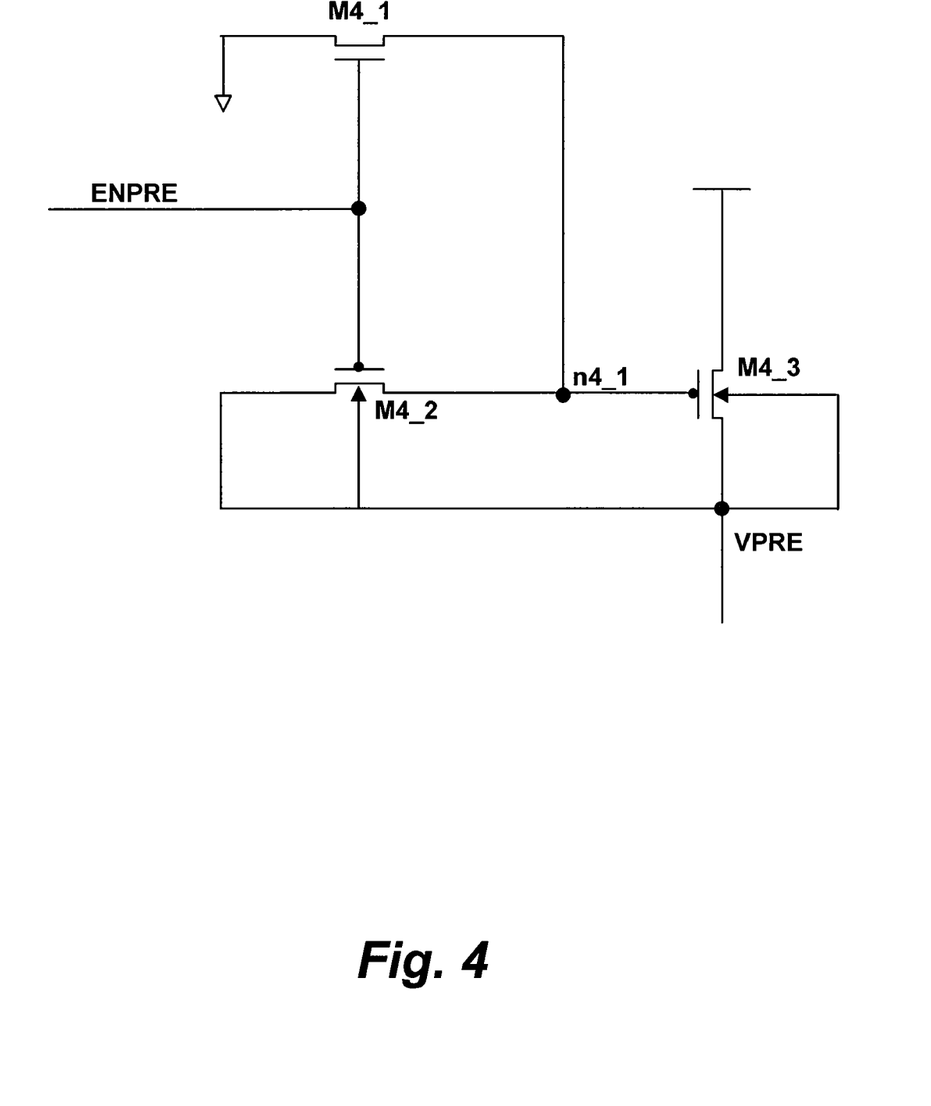
FIG. 4 is a simplified diagram illustrating an embodiment of the precharge circuit.

FIG. 4 is a simplified diagram illustrating an embodiment of the precharge circuit 303 or 305 shown in FIG. 3. The signal "ENPRE" is controlled by the clock control circuit 301 shown in FIG. 3. When this signal is "L", PMOS transistor M4_2 is turned on and VPRE node voltage goes up to boosting voltage, turning off PMOS M4_3. If ENPRE signal is "H", NMOS transistor M4_1 is turned on, causing node voltage Vn4_1 to be pulled down to 0V. Then, PMOS M4_3 is turned on and node voltage VPRE is precharged to Vcc. In the precharge circuit shown in the present embodiment, there is no threshold voltage loss across PMOS transistor M4_3. Therefore, node voltage VPRE can be precharged up to full Vcc, which is not achieved by conventional precharge circuit composed of single NMOS transistor, in which case node voltage VPRE can be precharged only to Vcc−Vt because of Vt loss across NMOS transistor.

Figure 5:
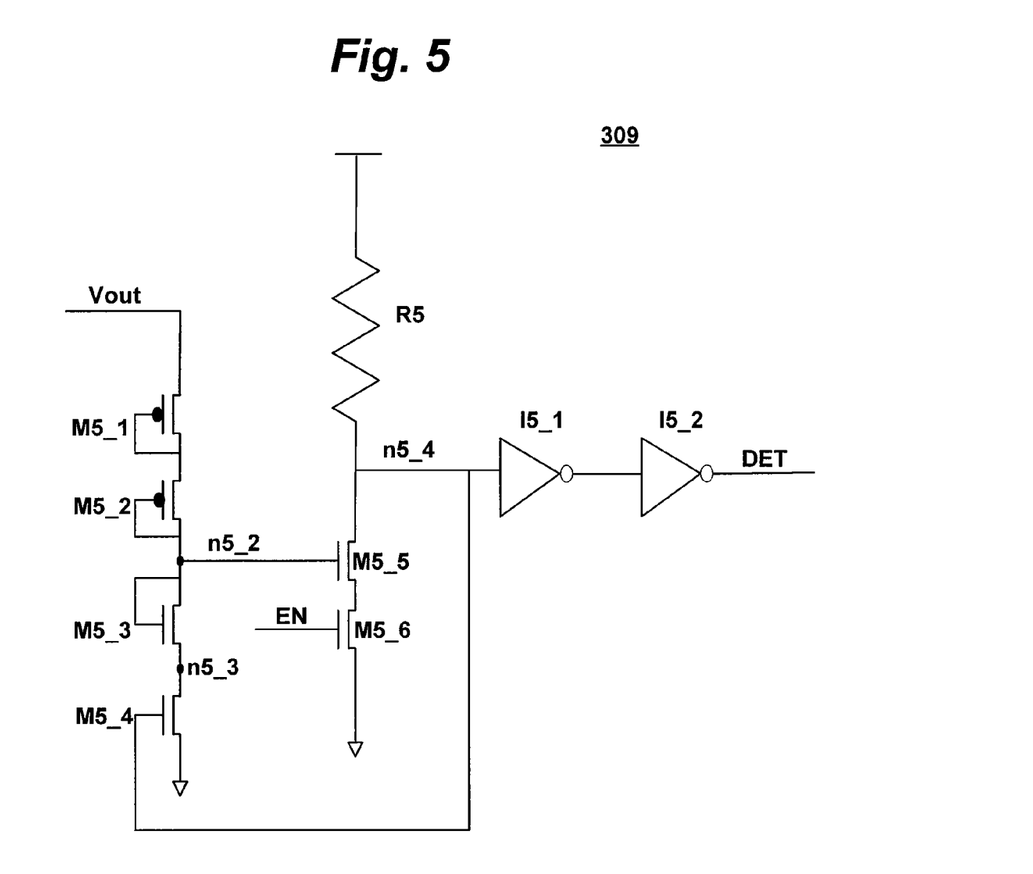
FIG. 5 is a simplified diagram illustrating an embodiment of the voltage detector.
Figure 7:
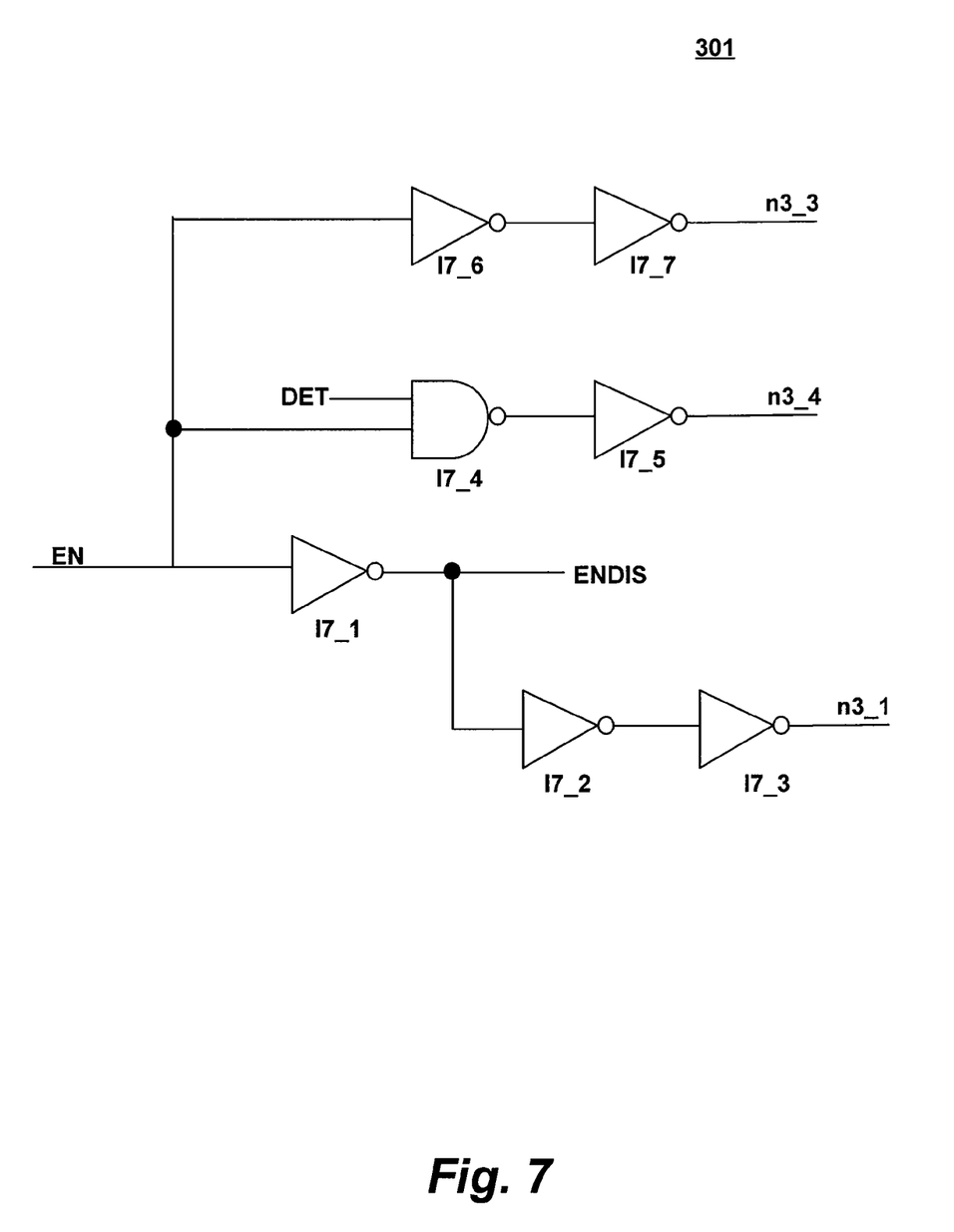
FIG. 7 is a simplified diagram illustrating an embodiment of the clock control circuit.

FIG. 5 is a simplified diagram illustrating an embodiment of the voltage detector 309 shown in FIG. 3. Referring to FIG. 3 and FIG. 5, output voltage Vout to be used as a word line voltage is input to a source electrode of PMOS transistor M5_1, which is connected to another PMOS transistor M5_2 in series, and the gate and drain nodes of these transistors are diode-connected as shown in FIG. 5. The drain node of PMOS M5_2 is connected to NMOS transistors M5_3 and M5_4 in series, and also connected to a gate electrode of NMOS transistor M5_5. Voltage at node n5_2 is determined by the condition of PMOS transistors M5-1, M5_2 and NMOS transistor M5_3. Transistor M5_4 is adapted to cut off the current at the inactive mode. The voltage at node n5_2 controls NMOS transistor M5_5. NMOS transistors M5_5 and M5_6 are in a cascade arrangement. The resistor R5 is a load resistor for the cascode amplifiers I5_1 and I5_2. The voltage at node n5_2 is equal to Vout−2Vt of PMOS transistors M5_1 and M5_2. The output signal DET of the voltage detector 309 is input to the clock control circuit 301. As illustrated in FIG. 7, this DET signal is used to disable the boosting capacitor C3_2 when one of the EN and DET signals is "L" level.

When Vout node is initially Vcc (power supply voltage), the initial voltage at node n5_4 is "H" (M5_4 is turned on) and the voltage at node n5_2 is around threshold voltage of NMOS transistor M5_3 or Vtn. After boosting (EN is "H", transistor M5_6 is turned on) from booster circuitry of FIG. 3, Vout voltage is increased above Vcc. As the Vout voltage increases, the voltage at node n5_2 also increases above threshold voltage of NMOS transistor M5_3, turning M5_3 and M5_5 on. Thus, the voltage at node n5_4 is pulled down to ground level. DET signal then goes to "L". Since the voltage at node n5_4 is "L", NMOS transistor M5_4 is turned off. NMOS transistor M5_6 is controlled by EN signal as shown in FIG. 3. Voltage detector 309 output signal DET is fed back to clock control circuit to control booster circuit output voltage Vout.

Figure 6:
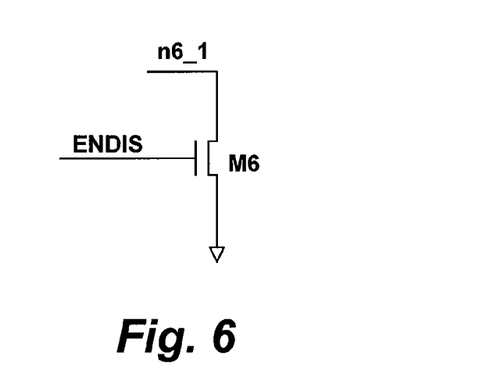
FIG. 6 is a simplified diagram illustrating an example the discharge circuit.

FIG. 6 is a circuit diagram illustrating an example the discharge circuit 307 shown in FIG. 3. The signal ENDIS is generated by inverting the signal EN as illustrated in FIG. 7 and is controlled by the clock control circuit 301 shown in FIG. 3. The voltage at node n3_6 shown in FIG. 3 is discharged through the NMOS transistor M6 after boosting.

FIG. 7 is a simplified circuit diagram illustrating an embodiment of the clock control circuit 301 shown in FIG. 3. The signal "EN" is connected to inverter I7_6 and NAND gate I7_4 to control the boosting clock at nodes n3_3 and n3_4 shown in FIG. 3. At the same time, it is input to inverter I7_1 to generate signal "ENDIS". This ENDIS signal enables the discharge circuit shown in FIG. 6 as mentioned above. The output signal of inverter I7_3 at node n3_1 controls PMOS transistor M3 as shown in FIG. 3.

Figure 8:
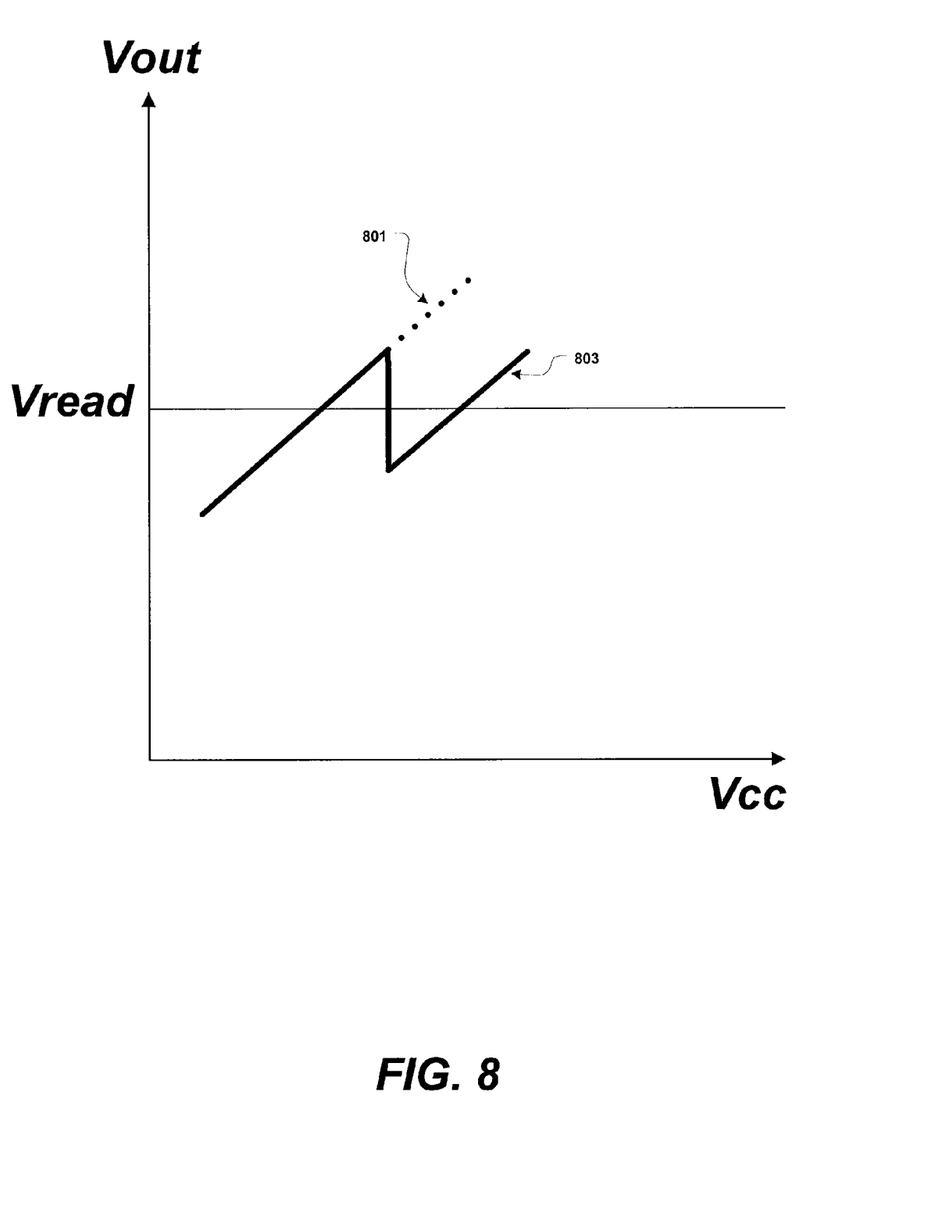
FIG. 8 is a simplified diagram illustrating an output voltage of the word line booster circuit vs. power supply voltage.

FIG. 8 is a diagram illustrating an output voltage Vout of the word line booster circuit vs. power supply voltage Vcc when the present invention is applied. Vread is a target word line voltage generated by the word line booster circuit for sensing data from nonvolatile memory cells during read mode or verify mode. A graph 801 illustrates a conventional boosting scheme. A graph 803 illustrates a boosting scheme according to one embodiment of the present invention. As illustrated in FIG. 8, a stable word line voltage is obtained from a wide range of power supply voltages.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A nonvolatile memory device comprising:
   a memory cell array having a plurality of memory cells arranged in rows and columns;
   a plurality of word lines and a plurality of bit lines associated with the memory cells; and
   a word line booster circuit coupled to the word lines for supplying a selected word line with a word line voltage during an operation of the memory device, wherein the word line booster circuit comprises:
   first and second boosting capacitors that are connected in parallel,
   a first precharge circuit for precharging the first boosting capacitor and the second boosting capacitor,
   a third boosting capacitor operatively coupled to the first and second boosting capacitors via a charge-sharing transistor, the third boosting capacitor being coupled to one end of a load resistor to generate an output signal at the other end of the load resistor to be used as the word line voltage when the charge sharing transistor is enabled,
   a second precharge circuit for precharging the third boosting capacitor,
   a voltage detector circuit adapted to generate a detecting signal when the word line voltage reaches a target voltage during a read mode operation of the nonvolatile memory device, and
   a clock control circuit adapted to enable the charge sharing transistor and to disable one of the first and second boosting capacitors upon receiving a control signal from an address transition detector and the detecting signal from the voltage detector.

2. The memory device of claim 1, wherein at least one additional boosting capacitor is coupled in parallel to the first and second boosting capacitors.

3. The memory device of claim 1 wherein the third boosting capacitor is coupled to a discharge circuit to discharge a boosted voltage by the first boosting capacitor or the second boosting capacitor in response to a discharge enable signal.

4. The memory device of claim 1 wherein the charge-sharing transistor is a PMOS transistor.

5. The memory device of claim 1 wherein the first precharge circuit comprises:
   an NMOS transistor having a gate electrode configured to receive a precharge enable signal from the clock control circuit and a drain electrode coupled to ground; and
   a PMOS transistor having a source electrode coupled to a power supply voltage, a drain electrode coupled to the first and second boosting capacitors, and a gate electrode coupled to a source electrode of the NMOS transistor, thereby precharging the first and second boosting capacitors up to the power supply voltage without threshold voltage loss.

6. The memory device of claim 1 wherein the voltage detector circuit generates the detecting signal in response to the control signal from the address transition detector and the output signal generated by the third boosting capacitor.

7. The memory device of claim 1 wherein the voltage detector circuit comprises:
   a first PMOS transistor and a second PMOS transistor connected in series;
   a first NMOS transistor and a second NMOS transistor connected in series each other, wherein a drain of the second PMOS transistor is connected to the first NMOS transistor and a gate electrode of a third NMOS transistor;
   a fourth NMOS transistor connected to the third NMOS transistor in series; and
   a load resistor connected to the power supply voltage and commonly connected to a source electrode of the third NMOS transistor and to a cascode amplifier for generating the detecting signal adapted to disable one of the first and second boosting capacitors.

8. The memory device of claim 7 wherein the load resistor is connected to a gate electrode of the second NMOS transistor.

9. The memory device of claim 7 wherein the cascode amplifier is composed of at least two stages.

10. A nonvolatile memory device comprising:
    an array of rows and columns of memory cells;
    a plurality of word lines and bit lines associated with the memory cells;
    a word line booster circuit coupled with the word lines for supplying a selected word line with the specific voltage as a drive voltage during an operation of the memory device, wherein the word line booster circuit comprises:
    a first boosting capacitor and a second boosting capacitor connected in parallel and adapted to generate a boosting voltage;
    a first precharge circuit for precharging the first boosting capacitor and the second boosting capacitor;
    a third boosting capacitor operatively connected to the first boosting capacitor and the second boosting capacitor via a charge-sharing transistor, the third boosting capacitor being connected to one end of a load resistor to generate an output signal at the other end of the load resistor when the charge sharing transistor is enabled;
    a high voltage detector adapted to generate a detecting signal in response to a control signal from an address transition detector and the output signal generated by the third boosting capacitor and the load resistor;
    a clock control circuit adapted to enable the charge sharing transistor and to disable one of the first boosting capacitor and the second boosting capacitor upon receiving the control signal from the address transition detector and the detecting signal from the voltage detector; and
    a discharge circuit to discharge the boosting voltage at a node connected to the third boosting capacitor.

11. The memory device of claim 10 wherein at least one additional boosting capacitor is connected in parallel to the first boosting capacitor and the second boosting capacitor.

12. The A memory device of claim 10 wherein the third boosting capacitor is connected to the discharge circuit to discharge the boosting voltage in response to a discharge enable signal.

13. The memory device of claim 10 wherein the charge-sharing transistor is PMOS transistor.

14. The memory device of claim 10 wherein the first precharge circuit for precharging the first boosting capacitor and the second boosting capacitor comprises:
    an NMOS transistor connected at its gate electrode to a precharge enable signal from the clock control circuit, the drain electrode of the NMOS transistor being connected to ground; and
    a PMOS transistor connected at its source electrode to the power supply voltage, the drain electrode of the PMOS transistor being connected to the first boosting capacitor and the second boosting capacitor, and the gate electrode of the PMOS transistor being connected to the source electrode of the NMOS transistor, thereby precharging the first boosting capacitor and the second boosting capacitor up to power supply voltage without threshold voltage loss.

15. The memory device of claim 10 wherein the high voltage detector circuit generates the detecting signal in response to the control signal from the address transition detector and the output signal generated by the third boosting capacitor.

16. The memory device of claim 10 wherein the high voltage detector circuit comprising:
    a first PMOS transistor and a second PMOS transistor connected in series, the gate and drain nodes of the first PMOS transistor and the second PMOS transistor are diode-connected;
    a drain node of the second PMOS transistor is connected to a first NMOS transistor and a second NMOS transistor connected in series each other, and is connected to a gate electrode of a third NMOS transistor;
    a fourth NMOS transistor connected to the third NMOS transistor in series; and
    a load resistor connected to the power supply voltage and commonly connected to a source electrode of the third NMOS transistor and to a cascode amplifier for generating the detecting signal adapted to disable one of the first boosting capacitor and the second boosting capacitor.

17. The memory device of claim 16 wherein the load resistor is connected to a gate electrode of the second NMOS transistor.

18. The memory device of claim 16 wherein the cascode amplifier comprises at least two stages.

19. The memory device of claim 1 wherein the first boosting capacitor comprises a first terminal and a second terminal, the second boosting capacitor comprises a third terminal and a fourth terminal, and the first and third terminals being directly connected together.

20. The memory device of claim 10 wherein the first boosting capacitor comprises a first terminal and a second terminal, the second boosting capacitor comprises a third terminal and a fourth terminal, and the first and third terminals being directly connected together.

* * * * *